United States Patent
Domen et al.

(10) Patent No.: US 10,337,112 B2
(45) Date of Patent: Jul. 2, 2019

(54) METHOD FOR PRODUCING PHOTOCATALYST ELECTRODE FOR WATER DECOMPOSITION

(71) Applicants: FUJIFILM Corporation, Tokyo (JP); THE UNIVERSITY OF TOKYO, Tokyo (JP); Japan Technological Research Association of Artificial Photosynthetic Chemical Process, Tokyo (JP)

(72) Inventors: Kazunari Domen, Tokyo (JP); Takashi Hisatomi, Tokyo (JP); Tsutomu Minegishi, Tokyo (JP); Chizhong Wang, Tokyo (JP); Chisato Katayama, Ashigara-kami-gun (JP)

(73) Assignees: FUJIFILM Corporation, Tokyo (JP); THE UNIVERSITY OF TOKYO, Tokyo (JP); JAPAN TECHNOLOGICAL RESEARCH ASSOCIATION OF ARTIFICIAL PHOTOSYNTHETIC CHEMICAL PROCESS, Tokyo (JP)

( * ) Notice: Subject to any disclaimer, the term of this patent is extended or adjusted under 35 U.S.C. 154(b) by 159 days.

(21) Appl. No.: 15/692,496

(22) Filed: Aug. 31, 2017

(65) Prior Publication Data

US 2017/0362721 A1    Dec. 21, 2017

Related U.S. Application Data

(63) Continuation of application No. PCT/JP2016/056830, filed on Mar. 4, 2016.

(30) Foreign Application Priority Data

Mar. 10, 2015  (JP) ................................ 2015-047287

(51) Int. Cl.
*C25B 11/04*   (2006.01)
*B01J 19/12*   (2006.01)
(Continued)

(52) U.S. Cl.
CPC ......... *C25B 11/0405* (2013.01); *B01J 19/123* (2013.01); *B01J 19/127* (2013.01);
(Continued)

(58) Field of Classification Search
USPC .......................................... 156/247
See application file for complete search history.

(56) References Cited

U.S. PATENT DOCUMENTS

2008/0073565 A1*  3/2008  Jeon ................. A61L 9/205
                                              250/455.11
2014/0004435 A1    1/2014  Tamura et al.
(Continued)

FOREIGN PATENT DOCUMENTS

JP    2007-45645 A    2/2007
JP    2013-91048 A    5/2013
(Continued)

OTHER PUBLICATIONS

International Preliminary Report on Patentability and Written Opinion of the International Searching Authority (Forms PCT/IB/326, PCT/IB/373 and PCT/ISA/237) for International Application No. PCT/JP2016/056830, dated Sep. 21, 2017, with an English Translation of the Written Opinion.
(Continued)

*Primary Examiner* — Sing P Chan
(74) *Attorney, Agent, or Firm* — Birch, Stewart, Kolasch & Birch, LLP

(57) ABSTRACT

Provided is a method for producing a photocatalyst electrode for water decomposition that exhibits excellent detachability between the substrate and the photocatalyst layer and exhibits high photocurrent density. The method for producing a photocatalyst electrode for water decomposition of the invention includes: a metal layer forming step of forming a metal layer on one surface of a first substrate by a vapor
(Continued)

phase film-forming method or a liquid phase film-forming method; a photocatalyst layer forming step of forming a photocatalyst layer by subjecting the metal layer to at least one treatment selected from an oxidation treatment, a nitriding treatment, a sulfurization treatment, or a selenization treatment; a current collecting layer forming step of forming a current collecting layer on a surface of the photocatalyst layer, the surface being on the opposite side of the first substrate; and a detachment step of detaching the first substrate from the photocatalyst layer.

20 Claims, 3 Drawing Sheets

(51) Int. Cl.
  C23C 14/58 (2006.01)
  C01B 3/04 (2006.01)
  C01B 13/02 (2006.01)
  C23C 14/00 (2006.01)
  C23C 14/16 (2006.01)
  C23C 14/34 (2006.01)
  C25B 1/00 (2006.01)
  B01J 35/02 (2006.01)
  B01J 27/24 (2006.01)
  B01J 37/20 (2006.01)
  B01J 37/12 (2006.01)
  C25B 1/04 (2006.01)

(52) U.S. Cl.
  CPC .............. *B01J 19/128* (2013.01); *B01J 27/24* (2013.01); *B01J 35/02* (2013.01); *B01J 37/12* (2013.01); *B01J 37/20* (2013.01); *C01B 3/04* (2013.01); *C01B 3/042* (2013.01); *C01B 13/0207* (2013.01); *C23C 14/0005* (2013.01); *C23C 14/165* (2013.01); *C23C 14/3464* (2013.01); *C23C 14/586* (2013.01); *C23C 14/5853* (2013.01); *C25B 1/003* (2013.01); *C25B 1/04* (2013.01); *C25B 11/0478* (2013.01); *B01J 2219/0877* (2013.01); *B01J 2219/0892* (2013.01); *B01J 2219/1203* (2013.01); *Y02E 60/364* (2013.01); *Y02E 60/366* (2013.01)

(56) References Cited

U.S. PATENT DOCUMENTS

2014/0374270 A1 12/2014 Minegishi et al.
2017/0362721 A1* 12/2017 Domen .................... B01J 37/12

FOREIGN PATENT DOCUMENTS

WO WO 2012/157193 A1 11/2012
WO WO 2013/133338-1 9/2013

OTHER PUBLICATIONS

International Search Report (Form PCT/ISA/210) for International Application No. PCT/JP2016/056830, dated May 17, 2016, including an English translation.

Minegishi et al., "Photoelectrochemical properties of $LaTiO_2N$ electrodes prepared by particle transfer for sunlight-driven water splitting," Chemical Science, vol. 4, 2013 (Published Dec. 11, 2012), pp. 1120-1124.

* cited by examiner

METHOD FOR PRODUCING PHOTOCATALYST ELECTRODE FOR WATER DECOMPOSITION

CROSS-REFERENCE TO RELATED APPLICATIONS

This application is a Continuation of PCT International Application No. PCT/JP2016/056830 filed on Mar. 4, 2016, which claims priority under 35 U.S.C. § 119(a) to Japanese Patent Application No. 2015-047287 filed on Mar. 10, 2015. The above application is hereby expressly incorporated by reference, in its entirety, into the present application.

BACKGROUND OF THE INVENTION

1. Field of the Invention

The present invention relates to a method for producing a photocatalyst electrode for water decomposition.

2. Description of the Related Art

From the viewpoints of reducing the carbon dioxide emission and promoting the use of clean energy, attention has been paid to technologies that produce hydrogen and oxygen by decomposing water by means of a photocatalyst by utilizing solar energy.

In recent years, research and development have been conducted on the water decomposition reaction by means of photocatalysts, and for example, a method of forming a photocatalyst electrode for water decomposition according to a particle transfer method is known.

As a specific example of the particle transfer method, WO2013/133338A discloses a production method of forming a photocatalyst electrode for water decomposition including a photocatalyst layer, a contact layer, and a current collecting layer, by disposing a photocatalyst layer containing photocatalyst particles on a base material, disposing a contact layer on the photocatalyst layer, further disposing a current collecting layer on the contact layer, and then detaching the base material.

SUMMARY OF THE INVENTION

Meanwhile, regarding the method for forming a photocatalyst layer, a method of forming a photocatalyst layer on an electrically conductive substrate having a current collecting layer and the like using a vapor phase film-forming method, a liquid phase film-forming method or the like, without using the particle transfer method described in WO2013/133338A, may be considered. However, due to the processes such as an oxidation treatment implemented at the time of forming a photocatalyst layer, the conductive substrate is damaged, and electrical conductivity of the conductive substrate is deteriorated. Therefore, such a method is not suitable as a method for forming a photocatalyst layer.

In regard to such a problem, if a transfer technique such as the particle transfer method described in WO2013/133338A is used as the method for forming a photocatalyst layer, the conductive substrate is not subjected to any damage. Therefore, there is an advantage that a photocatalyst layer can be formed while electrical conductivity of the conductive substrate is secured.

However, there is a problem that a photocatalyst layer laminated on a substrate (base material) by a vapor phase film-forming method or a liquid phase film-forming method is not easily detached from the substrate.

Meanwhile, in regard to the particle transfer method described in WO2013/133338A, in a case in which a photocatalyst layer is formed using photocatalyst particles, voids or necking portions may occur.

As such, in a case in which voids or necking portions occur in the photocatalyst layer, there may be deterioration in the recombination or electrical conductivity. Furthermore, the filling degree of the photocatalyst layer may be decreased, and thereby the photocurrent density of the photocatalyst electrode for water decomposition may have a lower value.

In view of such circumstances, it is an object of the invention to provide a method for producing a photocatalyst electrode for water decomposition that exhibits excellent detachability between the substrate and the photocatalyst layer and exhibits high photocurrent density.

The inventors of the present invention conducted a thorough investigation on the problems described above, and as a result, the inventors have found that the problems can be solved by forming a metal layer by a vapor phase film-forming method or a liquid phase film-forming method, subsequently subjecting the metal layer thus obtained to a treatment such as an oxidation treatment, and subsequently detaching the substrate. Thus, the inventors completed the invention.

That is, the present inventors found that the above-described problems can be solved by the following configurations.

[1] A method for producing a photocatalyst electrode for water decomposition, the method comprising:

a metal layer forming step of forming a metal layer on one surface of a first substrate by a vapor phase film-forming method or a liquid phase film-forming method;

a photocatalyst layer forming step of forming a photocatalyst layer by subjecting the metal layer to at least one treatment selected from an oxidation treatment, a nitriding treatment, a sulfurization treatment, or a selenization treatment;

a current collecting layer forming step of forming a current collecting layer on a surface of the photocatalyst layer, the surface being on the opposite side of the first substrate; and a detachment step of detaching the first substrate from the photocatalyst layer.

[2] The method for producing a photocatalyst electrode for water decomposition according to [1], wherein the photocatalyst layer forming step is a step of performing the oxidation treatment, and then performing at least one treatment selected from the nitriding treatment, the sulfurization treatment, or the selenization treatment.

[3] The method for producing a photocatalyst electrode for water decomposition according to [1] or [2], wherein the metal that constitutes the metal layer is at least one metal selected from the group consisting of Ta, Nb, Ti, W, Ba, La, Sr, Ca, Fe, Bi, V, Zn, Cu, Ni, Pb, Ag, Cd, Ga, In, Sm, or Mg.

[4] The method for producing a photocatalyst electrode for water decomposition according to any one of [1] to [3], further comprising:

after the photocatalyst layer forming step and before the current collecting layer forming step, a contact layer forming step of forming a contact layer containing a semiconductor or a good conductor on a surface of the photocatalyst layer, the surface being on the opposite side of the first substrate.

[5] The method for producing a photocatalyst electrode for water decomposition according to any one of [1] to [4], further comprising:

after the current collecting layer forming step and before the detachment step, a second substrate laminating step of laminating a second substrate on a surface of the current collecting layer, the surface being on the opposite side of the photocatalyst layer.

[6] The method for producing a photocatalyst electrode for water decomposition according to any one of [1] to [5], wherein the photocatalyst layer has a thickness of 100 to 1,200 nm.

[7] The method for producing a photocatalyst electrode for water decomposition according to any one of [1] to [6], wherein the first substrate is a silicon substrate.

As described below, according to the invention, a method for producing a photocatalyst electrode for water decomposition that exhibits excellent detachability between a substrate and a photocatalyst layer and exhibits high photocurrent density can be provided.

DESCRIPTION OF THE PREFERRED EMBODIMENTS

Figure 1A:
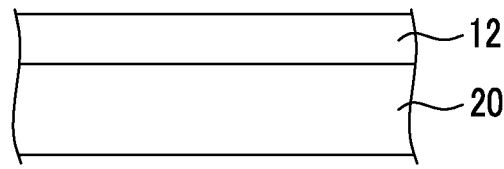
FIGS. 1A to 1D are schematic cross-sectional views illustrating an embodiment of a method for producing a photocatalyst electrode for water decomposition of the invention in the order of processes.

A numerical value range expressed using the term "to" in the invention means a range including the numerical values described before and after the term "to" as the lower limit and the upper limit.

The meaning of the phrase "B is formed on A" according to the invention includes the concept that "B is formed immediately above A", as well as the concept that "B is formed above A". Specifically, in addition to the meaning of the concept that "B is formed immediately above A", which indicates that "A" and "B" are in contact, the case in which one or more "other layers" other than "B" exist immediately above "A", and "B" is formed "immediately above the other layers", is also intended to be included in the concept of the phrase "B is formed on A".

In the following description, the method for producing a photocatalyst electrode for water decomposition of the invention will be described in detail.

According to the method for producing a photocatalyst electrode for water decomposition of the invention, a photocatalyst electrode for water decomposition that exhibits excellent detachability between a substrate and a photocatalyst electrode layer and exhibits high photocurrent density can be obtained. The details of this mechanism are not clearly understood yet; however, it is generally speculated that the mechanism is as follows.

That is, when a photocatalyst electrode layer is formed, first, a metal layer is formed on a substrate (first substrate that will be described below) using a vapor phase film-forming method or a liquid phase film-forming method, and then the metal layer is converted to a photocatalyst layer by subjecting the metal layer thus obtained to a treatment process such as an oxidation treatment. As such, in a case in which the metal layer is converted to a photocatalyst layer, there occurs a density change in the layer before and after the treatment. Thereby, the adhesiveness between the substrate and the photocatalyst layer is deteriorated, and thus, the two are brought to a state of being easily detachable. Thus, it is considered that the photocatalyst layer after detachment becomes a photocatalyst layer having a smooth (flat) surface.

Since the photocatalyst layer is a film formed by a vapor phase film-forming method or a liquid phase film-forming method, voids such as those in the photocatalyst electrode layer obtainable by using photocatalyst particles, are not easily formed.

For these reasons, it is believed that according to the invention, a photocatalyst electrode for water decomposition that exhibits excellent detachability from the substrate and exhibits high photocurrent density can be produced.

The method for producing a photocatalyst electrode for water decomposition of the invention includes a metal layer forming step of forming a metal layer on one surface of a first substrate by a vapor phase film-forming method or a liquid phase film-forming method; a photocatalyst layer forming step of forming a photocatalyst layer by subjecting the metal layer described above to at least one treatment selected from an oxidation treatment, a nitriding treatment, a sulfurization treatment, or a selenization treatment; a current collecting layer forming step of forming a current collecting layer on a surface of the photocatalyst layer, the surface being on the opposite side of the first substrate; and a detachment step of detaching the first substrate from the photocatalyst layer.

The method for producing a photocatalyst electrode for water decomposition of the invention will be explained in detail with reference to the drawings.

<Metal Layer Forming Step>

The metal layer forming step is a step of forming a metal layer on one surface of a first substrate by a vapor phase film-forming method or a liquid phase film-forming method.

FIGS. 1A to 1D are partial cross-sectional views schematically illustrating an embodiment of the method for producing a photocatalyst electrode for water decomposition of the invention, and in FIG. 1A, the metal layer 12 is disposed on (immediately above) the first substrate 20.

Regarding the first substrate 20, it is preferable to select a material that is inert to a reaction with a photocatalyst and has excellent chemical stability and heat resistance, and examples thereof include a silicon substrate (Si substrate), a silicon oxide substrate ($SiO_2$ substrate), and a silicon nitride substrate ($Si_3N_4$ substrate). Among these substrates, from the viewpoint of having excellent detachability from the photocatalyst layer, it is preferable to use a silicon substrate as the first substrate 20.

In a case in which a silicon substrate is used as the first substrate 20 as such, the reason why the detachability between the first substrate and the photocatalyst layer is enhanced is speculated to be as follows. That is, a silicon substrate has excellent smoothness of the surface as compared to other materials. Furthermore, a silicon substrate does not easily undergo a change similar to that occurring in the metal layer in a case in which the metal layer is subjected to the various treatments (oxidation treatment and the like) that will be described below. Thus, it is considered that an enhancement in detachability is brought about.

The surface of the first substrate 20 on which the metal layer is disposed may be subjected to at least one of a polishing treatment or a cleaning treatment in advance.

The metal layer 12 may be formed in at least a partial region on one surface of the first substrate 20 by a vapor phase film-forming method or a liquid phase film-forming method, or may be formed over the whole surface of one surface of the first substrate 20 (including the lateral surfaces of the first substrate 20).

According to the invention, regarding the liquid phase film-forming method (liquid phase growing method), conventionally known methods can all be used, and examples include a plating method (an electroplating method, an electroless plating method), a sol-gel method, and a coating method.

Among these liquid phase film-forming methods, from the viewpoint that it is not necessary to use a conductive substrate, and it is easy to obtain a metal layer having relatively high purity, it is preferable to use a plating method, and it is preferable to use an electroless plating method.

According to the invention, regarding the vapor phase film-forming method (vapor phase growing method), conventionally known methods can all be used, and examples include chemical vapor deposition (CVD), as well as physical vapor deposition (PVD) such as an evaporation method (electron beam evaporation method or the like), a sputtering method, and an ion plating method.

Among these vapor phase film-forming methods, from the viewpoints that there are fewer restrictions at the time of selecting the substrate or the metal material, that the flatness of the metal layer can be further enhanced, and that it is easier to control the thickness, it is preferable to use a physical vapor deposition method, and it is more preferable to use a sputtering method and an electron beam evaporation method.

In regard to the pressure in the case of forming the metal layer 12, usually, the vapor phase film-forming method is carried out under reduced pressure, and the liquid phase film-forming method is carried out at atmospheric pressure.

The specific pressure (back pressure) for the vapor phase film-forming method is not limited to this; however, for example, the pressure can be adjusted to $0.5 \times 10^{-5}$ to $5.0 \times 10^{-5}$ Pa. The pressure at the time of gas inlet is not limited to this; however, the pressure can be adjusted to $0.1 \times 10^{-1}$ to $3.0 \times 10^{-1}$ Pa.

The temperature conditions in the case of forming the metal layer 12 may be appropriately determined according to the type of the metal material used for the formation of the metal layer 12, or the like. The temperature of the first substrate 20 at this time is approximately equal to the temperature in the case of forming the metal layer.

Other conditions (film-forming rate and the like) for forming the metal layer 12 are not particularly limited and can be appropriately set.

Regarding the thickness of the metal layer 12, from the viewpoint that the treatment performed in the photocatalyst layer forming step that will be described below is more effectively carried out, and from the viewpoint that superior water decomposition efficiency is obtained on the occasion of converting the metal layer to the photocatalyst layer that will be described below, the thickness is preferably 150 to 600 nm, more preferably 200 to 550 nm, and even more preferably 250 to 500 nm.

According to the invention, the thicknesses (film thicknesses) of the various layers can be determined from, for example, an image of cross-sections of the various layers taken using a scanning electron microscope (trade name "FIELD-EMISSION TYPE SCANNING ELECTRON MICROSCOPE (FE-SEM) SU8220", manufactured by Hitachi High-Technologies Corporation).

The metal layer 12 is formed by a vapor phase film-forming method or a liquid phase film-forming method using a metallic material.

The metal that constitutes the metal layer 12 (that is, the metal material used for forming the metal layer) is not particularly limited as long as the metal can form a photocatalyst layer 12a by the treatment carried out in the photocatalyst layer forming step that will be described below (oxidation treatment or the like). However, from the viewpoint of having high performance as a photocatalyst, the metal is preferably at least one metal selected from the group consisting of Ta, Nb, Ti, W, Ba, La, Sr, Ca, Fe, Bi, V, Zn, Cu, Ni, Pb, Ag, Cd, Ga, In, Sm, or Mg.

In regard to the vapor phase film-forming method and the liquid phase film-forming method used in the metal forming step, any method appropriate for the type of the metal material to be used may be appropriately selected. However, when a vapor phase film-forming method is used, there is an advantage that the production of a mixed metal is facilitated, or since organic materials, moisture and the like are not easily incorporated, a flat metal film having high purity is obtained.

Identification of the components that constitute the metal layer 12 is carried out using an XRD (X-ray diffraction) analyzer (for example, product name "Horizontal Sample Type Multi-purpose X-ray Diffraction Apparatus ULTIMA III" manufactured by Rigaku Corporation).

<Photocatalyst Layer Forming Step>

The photocatalyst layer forming step is a step of forming a photocatalyst layer by subjecting the metal layer to at least one treatment selected from an oxidation treatment, a nitriding treatment, a sulfurization treatment, or a selenization treatment. That is, the photocatalyst layer is formed on the side of the surface where the metal layer has been formed, on the first substrate.

Figure 1B:
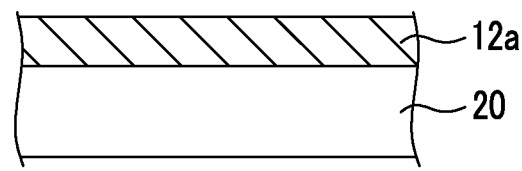

FIG. 1B is a partial cross-sectional view schematically illustrating an example of the state of formation of the photocatalyst layer 12a. Specifically, FIG. 1B illustrates the state in which the metal layer 12 has been converted to the photocatalyst layer 12a by means of the above-described treatment, and the photocatalyst layer 12a is disposed on (immediately above) the first substrate 20.

From the viewpoint of further enhancing detachability, it is preferable that the photocatalyst layer 12a is a layer obtained by subjecting the entirety of the metal layer 12 to various treatments; however, as long as the photocatalyst layer 12a has sufficient detachability from the first substrate 20, that a portion of the metal layer may remain as metal (that is, a material that is not a metal oxide or the like).

The treatment that is carried out in order to form the photocatalyst layer 12a is at least one treatment selected from an oxidation treatment, a nitriding treatment, a sulfurization treatment, or a selenization treatment. By performing such various treatments, the photocatalyst layer 12a containing a photocatalyst is obtained.

Regarding the various treatments (the above-mentioned oxidation treatment, nitriding treatment, sulfurization treatment, and selenization treatment), only one treatment may be carried out, or two or more treatments may be carried out in combination. However, from the viewpoint of further enhancing detachability and the photocurrent density, it is preferable to carry out two or more treatments in combination. One of the reasons why the detachability and the photocurrent density are further enhanced as such is that in the stage for forming the photocatalyst layer 12a, a change in the density of the film associated with the various treatments occurs several times.

In the case of carrying out two or more treatments from among the various treatments, it is preferable that the oxidation treatment is carried out first, and then at least one treatment selected from the nitriding treatment, the sulfurization treatment, or the selenization treatment is carried out. Thereby, the change in density of the photocatalyst layer 12a is achieved more smoothly, and therefore, detachability is further enhanced. In this case, the photocatalyst layer 12a is formed via a state of being a metal oxide.

Furthermore, according to another preferred embodiment of the case of carrying out two or more treatments from among the various treatments, the oxidation treatment, the sulfurization treatment, and the selenization treatment may be carried out in this order. Thereby, the change in density of the photocatalyst layer 12a is achieved more smoothly, and accordingly, detachability is further enhanced. In this case, the photocatalyst layer 12a is formed via a state of being a metal oxide and a state of being an oxysulfide.

Among the treatments described above, regarding the method of performing the oxidation treatment, conventionally known methods can all be used, and there are no particular limitations; however, a method of heating (calcining) the metal layer 12 (or the metal layer 12 that has been subjected to the above-mentioned treatments except for the oxidation treatment) in air may be used.

The heating temperature (calcination temperature) in the case of performing the oxidation treatment is preferably 500° C. to 1,000° C., more preferably 700° C. to 1,000° C., and even more preferably 700° C. to 950° C., from the viewpoint that the photocurrent density is further increased.

Other conditions (for example, heating time) employed in the case of performing the oxidation treatment are not particularly limited, and the conditions can be appropriately set in accordance with the type of the metal that constitutes the metal layer 12, or the like.

Among the treatments described above, regarding the method of performing the nitriding treatment, conventionally known methods can all be used and are not particularly limited; however, a method of heating (calcining) the metal layer 12 (or the metal layer 12 that has been subjected to the above-mentioned treatments except for a nitriding treatment) under an ammonia gas stream may be employed.

The heating temperature (calcination temperature) in the case of performing the nitriding treatment is preferably 800° C. to 1,050° C., more preferably 850° C. to 1,000° C., and even more preferably 900° C. to 1,000° C., from the viewpoint that the photocurrent density is further increased.

Other conditions (for example, heating time) employed in the case of performing the nitriding treatment are not particularly limited, and the conditions can be appropriately set in accordance with the type of the metal that constitutes the metal layer 12, or the like.

Among the treatments described above, regarding the method of performing the sulfurization treatment, conventionally known methods can all be used and are not particularly limited; however, a method of heating (calcining) the metal layer 12 (or the metal layer 12 that has been subjected to the above-mentioned treatments except for the sulfurization treatment) under hydrogen sulfide, a method of vacuum sealing a raw material including the metal layer 12 and powdered sulfur in a quartz tube, and heating (calcining) the vacuum-sealed quartz tube, may be employed.

The heating temperature (calcination temperature) in the case of performing the sulfurization treatment is preferably 300° C. to 1,500° C., and more preferably 400° C. to 1,200° C., from the viewpoint that the photocurrent density is further increased.

Other conditions (for example, heating time) employed in the case of performing the sulfurization treatment are not particularly limited, and the conditions can be appropriately set in accordance with the type of the metal that constitutes the metal layer 12, or the like.

Among the treatments described above, regarding the method of performing the selenization treatment, conventionally known methods can all be used and are not particularly limited; however, a method of vacuum sealing a raw material including the metal layer 12 and powdered selenium in a quartz tube, and heating (calcining) the vacuum-sealed quartz tube, may be employed.

The heating temperature (calcination temperature) in the case of performing a selenization treatment is preferably 200° C. to 1,000° C., and more preferably 500° C. to 1,000° C., from the viewpoint that the photocurrent density is further increased.

Other conditions (for example, heating time) employed in the case of performing a selenization treatment are not particularly limited, and the conditions can be appropriately set in accordance with the type of the metal that constitutes the metal layer 12, or the like.

The thickness of the photocatalyst layer 12a is preferably 100 to 1,200 nm, more preferably 400 to 1,100 nm, and even more preferably 500 to 1,000 nm, from the viewpoint of having excellent water decomposition efficiency. If the thickness is 100 nm or more, the flatness of the surface of the photocatalyst layer 12a tends to further increase. If the thickness is 1,200 nm or less, the distance of travel of excited species is in an appropriate range, and therefore, the photocatalytic function is satisfactorily exhibited.

The photocatalyst layer 12a is a layer containing a photocatalyst (photocatalytic material) obtainable by subjecting the metal that constitutes the metal layer 12 to the above-mentioned treatments. Examples of the type of the photocatalyst include oxide, nitride, sulfide, selenide, oxynitride, oxysulfide, oxyselenide, and oxysulfoselenide of the metal that constitutes the metal layer 12 (at least one metal selected from Ta, Nb, Ti, W, Ba, La, Sr, Ca, Fe, Bi, V, Zn, Cu, Ni, Pb, Ag, Cd, Ga, In, Sm, or Mg).

Examples of such a photocatalyst include oxides such as $SrTiO_3$, $LaTi_2O_7$, $TiO_2$, $WO_3$, $Fe_2O_3$, and $BiVO_4$; nitrides (nitride compounds) such as $Ta_3N_5$; sulfides (sulfide compounds) such as ZnS, ZnS doped with Cu, Ni or Pb, CdS doped with Ag, $Cd_xZn_{1-x}S$, $CuInS_2$, $CuIn_5S_8$, $CuGaS_2$, $CuGa_3S_5$, $CuGa_5S_8$, $AgGaS_2$, $AgGa_3S_5$, $AgGa_5S_8$, $AgGa_{0.9}In_{0.1}S_2$, $AgIn_5S_8$, $NaInS_2$, $AgInZn_7S_9$, $CuInGaS_2$, $Cu_{0.09}In_{0.09}Zn_{1.82}S_2$, $Cu_{0.25}Ag_{0.25}In_{0.5}ZnS_2$, and $Cu_2ZnSnS_4$; selenides (selenium compounds) such as $CuGaSe_2$, $CuGa_3Se_5$, $CuGa_5Se_8$, $Ag_xCu_{1-x}GaSe_2$, $Ag_xCu_{1-x}Ga_3Se_5$, $Ag_xCu_{1-x}Ga_5Se_8$, $AgGaSe_2$, $AgGa_3Se_5$, $AgGa_5Se_8$, and $CuInGaSe_2$; oxynitrides (oxynitride compounds) such as $LaTiO_2N$, $BaNbO_2N$, $CaTaO_2N$, $SrTaO_2N$, $SrNbO_2N$, $BaTaO_2N$, and $LaTaO_2N$; oxysulfides (oxysulfide compounds) such as $Sm_2Ti_2S_2O_5$, $La_5Ti_2CuS_5O_7$, $La_5Ti_2AgS_5O_7$, and $La_5Ti_2AgO_5S_7$; oxyselenides (oxyselenide compounds) such as $La_5Ti_2CuSe_5O_7$ and $La_5Ti_2AgSe_5O_7$; and chalcogenide compounds partially mixed with S and Se at an arbitrary proportion, such as $La_5Ti_2Cu(S_x, Se_{1-x})_5O_7$ and $La_5Ti_2Ag(S_x, Se_{1-x})_5O_7$.

Among the photocatalysts described above, the photocatalyst is preferably a visible light-responsive photocatalyst. Above all, the photocatalyst is more preferably a nitride or an oxynitride.

Identification of the components that constitute the photocatalyst layer 12a is carried out in the same manner as in the identification of the components that constitute the metal layer 12 described above.

<Current Collecting Layer Forming Step>

The current collecting layer forming step is a step of forming a current collecting layer on a surface of the photocatalyst layer, the surface being on the opposite side of the first substrate. The current collecting layer accomplishes the role of causing the electrons produced in the photocatalyst layer to flow.

Figure 1C:
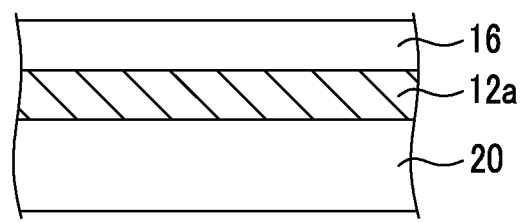

FIG. 1C is a partial cross-sectional view schematically illustrating an example of the state of formation of the current collecting layer 16, and illustrates the state in which the current collecting layer 16 is formed on (immediately above) the photocatalyst layer 12a.

In the example of FIG. 1C, the current collecting layer 16 is provided over the whole surface (entirety of the surface) of the photocatalyst layer 12a; however, the invention is not limited to this, and the current collecting layer 16 may also be provided in a portion of the surface of the photocatalyst layer 12a.

The shape of the current collecting layer 16 is not particularly limited, and for example, the shape may be a perforated metal sheet form, a mesh form, a lattice form, or a porous body having pores that penetrate through.

The method for forming the current collecting layer 16 is not particularly limited; however, from the viewpoint that the adhesiveness to other layers can be enhanced, it is preferable that the formation is performed by the vapor phase film-forming method described above, and it is more preferable that the formation is performed by a physical vapor deposition method. Particularly, among the physical vapor deposition methods, from the viewpoint that the damage to the layers (particularly, the photocatalyst layer 12a) that have been formed earlier can be reduced, an evaporation method (for example, a resistance heating evaporation method, a high frequency heating evaporation method, an electron beam evaporation method, or an ion beam evaporation method (ion beam assisted evaporation method)).

The conditions (film-forming rate, temperature, and the like) at the time of forming the current collecting layer 16 may be appropriately set depending on the materials used, and are not particularly limited.

The thickness of the current collecting layer 16 is not particularly limited; however, from the viewpoint of the balance between the electrical conduction characteristics and the cost, the thickness is preferably 0.1 μm to 10 mm, and more preferably 1 μm to 2 mm.

The material that constitutes the current collecting layer 16 is not particularly limited, and any material that can be formed by the above-mentioned evaporation method and exhibits electrical conduction characteristics may be used. Examples thereof include simple metals and alloys thereof. Specific examples of the material that constitutes the current collecting layer 16 include Au, Al, Cu, Cd, Co, Cr, Fe, Ga, Ge, Hg, Ir, In, Mn, Mo, Nb, Ni, Pb, Pd, Pt, Ru, Re, Rh, Sb, Sn, Ta, Ti, V, W, Zn, TiN, $TiO_2$, $Ta_3N_5$, TaON, ZnO, $SnO_2$, indium tin oxide (ITO), SnO, $TiO_2$(:Nb), $SrTiO_3$(:Nb), fluorine-doped tin oxide (FTO), $CuAlO_2$, $CuGaO_2$, $CuInO_2$, ZnO(:Al), ZnO(:Ga), ZnO(:In), GaN, GaN(:C), GaN(:Si), GaN(:Sn), and C; and alloys and mixtures thereof.

According to the present specification, in a case in which the description is in the form of α(:β), it implies that α is doped with β. For example, $TiO_2$(:Nb) means that $TiO_2$ is doped with Nb.

Above all, from the viewpoint that oxidation of the material in the current collecting layer 16 does not easily occur, and the electrical conduction characteristics are maintained more effectively, it is preferable that the current collecting layer 16 contains tin (Sn) or gold (Au), and more preferably tin.

<Detachment Step>

Figure 1D:
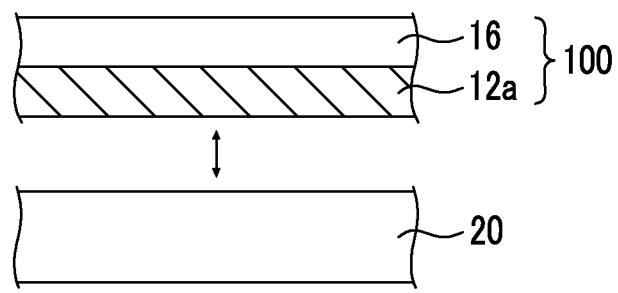

The detachment step is a step of detaching the first substrate from the photocatalyst layer. FIG. 1D is a partial cross-sectional view schematically illustrating an example of the state after detachment between the first substrate 20 and the photocatalyst layer 12a, and shows the situation in which the first substrate 20 and the photocatalyst layer 12a (and the current collecting layer 16) are separated, and thereby a photocatalyst electrode for water decomposition 100 is obtained.

In the example of FIG. 1D, the detachment step is carried out after the current collecting layer 16 is formed (that is, after the current collecting layer forming step); however, the timing of carrying out the detachment step is not limited to this.

For example, in a case in which a second substrate 22 (see FIG. 3A that will be described below) is provided on a surface of the first substrate 20, the surface being on the side where the current collecting layer 16 has been provided, the detachment step may be carried out after the second substrate 22 is laminated (that is, a second substrate laminating step).

The detachment step may be carried out before the current collecting layer 16 is formed; however, from the viewpoint of the strength of the photocatalyst layer 12a, or from the viewpoint that detachment is easily achieved, it is preferable that the detachment step is carried out after the current collecting layer 16 is formed (after the current collecting layer forming step) as described above.

The method of detaching the first substrate 20 is not particularly limited; however, for example, a method of mechanically detaching the first substrate 20, or a method of physically destroying the first substrate 20 and thereby detaching (removing) the first substrate 20 may be employed. However, from the viewpoint that the possibility of any damage to the photocatalyst layer 12a is low, or from the viewpoint that reutilization of the first substrate 20 can be implemented, a method of mechanically detaching the first substrate 20 is preferred.

The method of mechanically detaching the first substrate 20 is not particularly limited; however, for example, a method of detaching the first substrate 20 from the photocatalyst layer 12a using a suction apparatus (vacuum pump or the like) equipped with a suction mechanism (suction cap or the like), may be employed.

<Contact Layer Forming Step>

The method for producing a photocatalyst electrode for water decomposition of the invention may further include a contact layer forming step. The contact layer forming step is a step coming after the photocatalyst layer forming step and before the current collecting layer forming step, and is a step of forming a contact layer containing a semiconductor or a good conductor on a surface of the photocatalyst layer, the surface being on the opposite side of the first substrate.

A contact layer is an optional layer that may be disposed between the photocatalyst layer and the current collecting layer.

The contact layer is characterized by preventing the occurrence of the Schottky barrier by selecting and using a metal that would have Ohmic junction, or even in a case in which the Schottky barrier occurs, by reducing this and thereby rapidly implementing electron conduction.

The contact layer may also have the role as a strength reinforcing layer of the current collecting layer, in addition to the characteristics described above, and for example, in the case of using tin as the current collecting layer, the effect is significant.

Figure 2A:
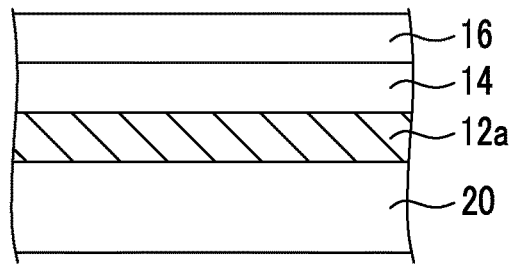
FIGS. 2A and 2B are schematic cross-sectional views illustrating partial processes according to an embodiment of the method for producing a photocatalyst electrode for water decomposition of the invention.

FIG. 2A is a partial cross-sectional view schematically illustrating an example of the state of formation of the contact layer 14, and illustrates the state in which the contact layer 14 is formed at a position that is on (immediately above) the photocatalyst layer 12a and beneath the current collecting layer 16.

The method for forming the contact layer 14 is not particularly limited; however, for the same reason as that for the current collecting layer 16, it is preferable that the formation is carried out by a vapor phase film-forming method, it is more preferable that the formation is carried out by a physical vapor deposition method, and it is even more preferable that an evaporation method is used.

The conditions (film-forming rate, temperature and the like) at the time of forming the contact layer 14 may be appropriately set according to the material used, and are not particularly limited.

Figure 2B:
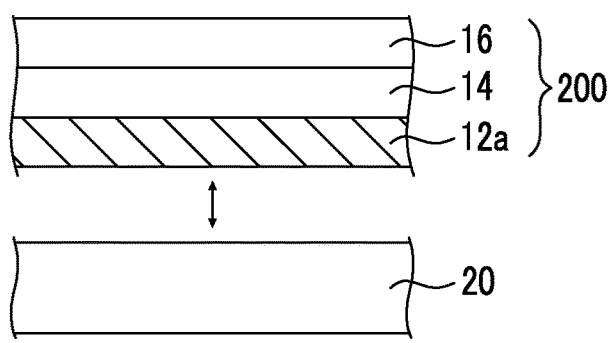

FIG. 2B is a partial cross-sectional view schematically illustrating an example of the state after the detachment of the first substrate 20 and the photocatalyst layer 12a in the case in which the photocatalyst electrode has a contact layer 14, and the diagram shows the situation in which the first substrate 20 and the photocatalyst layer 12a (and the current collecting layer 16) are separated, and thereby a photocatalyst electrode for water decomposition 200 is obtained.

In the example of FIG. 2B, the detachment step is carried out after the formation of the current collecting layer 16 (after the current collecting layer forming step); however, the invention is not limited to this, and the detachment step may also be carried out after the formation of the contact layer 14 (after the contact layer forming step) and before the formation of the current collecting layer 16 (before the current collecting layer forming step).

The thickness of the contact layer is not particularly limited; however, from the viewpoint of further enhancing the function of reinforcing the photocatalyst layer during the detachment step, for example, the thickness is preferably 0.3 nm or more, more preferably 1 nm or more, even more preferably 5 nm or more, still more preferably 10 nm or more, and particularly preferably 20 nm or more, and in many cases, the thickness is 1 mm or less.

In a case in which the detachment step is carried out after the formation of the contact layer 14 and before the formation of the current collecting layer 16, from the viewpoint of maintaining the strength of the photocatalyst layer 12a during detachment, the thickness of the contact layer 14 is preferably 2 m or more (preferably 3 μm or more and 5 mm or less).

The contact layer 14 is a layer containing a semiconductor or a good conductor. Regarding the semiconductor or the good conductor, it is preferable to use a material that exhibits satisfactory electrical conductivity and does not catalyze a reverse reaction of the water decomposition reaction or a reaction that forms a counterpart to the water decomposition reaction of the photocatalyst.

Examples of the material that constitutes the contact layer 14 include Au, Al, Cu, Cd, Co, Cr, Fe, Ga, Ge, Hg, Ir, In, Mn, Mo, Nb, Ni, Pb, Pd, Pt, Ru, Re, Rh, Sb, Sn, Ta, Ti, V, W, Zn, TiN, $TiO_2$, $Ta_3N_5$, TaON, ZnO, $SnO_2$, indium tin oxide (ITO), SnO, $TiO_2$(:Nb), $SrTiO_3$(:Nb), fluorine-doped tin oxide (FTO), $CuAlO_2$, $CuGaO_2$, $CuInO_2$, ZnO(:Al), ZnO(:Ga), ZnO(:In), GaN, GaN(:C), GaN(:Si), GaN(:Sn), and C; and alloys and mixtures thereof.

<Other Steps>

The method for producing a photocatalyst electrode for water decomposition of the invention may further include steps other than those described above. Examples of such steps include a second substrate laminating step and a catalyst promoter supporting step.

(Second Substrate Laminating Step)

The second substrate laminating step is a step that is carried out after the current collecting layer forming step and before the detachment step, and is a step of laminating a second substrate on a surface of the current collecting layer, the surface being on the opposite side of the photocatalyst layer.

The second substrate is formed from the viewpoint of reinforcing the photocatalyst layer and the current collecting layer, and facilitating the detachment in the detachment step.

Figure 3A:
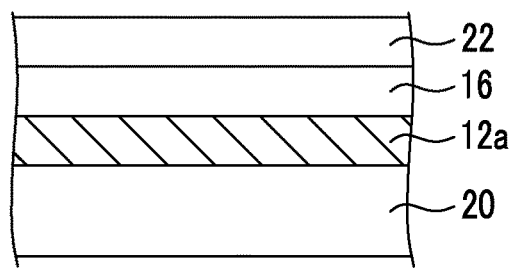
FIGS. 3A and 3B are schematic cross-sectional views illustrating partial processes according to an embodiment of the method for producing a photocatalyst electrode for water decomposition of the invention.

FIG. 3A is a partial cross-sectional view schematically illustrating an example of the state of formation of the second substrate 22, and illustrates the state in which the second substrate is formed on (immediately above) the current collecting layer 16.

In the example of FIG. 3A, the contact layer 14 mentioned above is not provided; however, the invention is not limited to this, and the photocatalyst layer may have both the contact layer 14 and the second substrate 22. Thereby, the force that reinforces the photocatalyst layer 12a and the current collecting layer 16 is further increased.

Figure 3B:
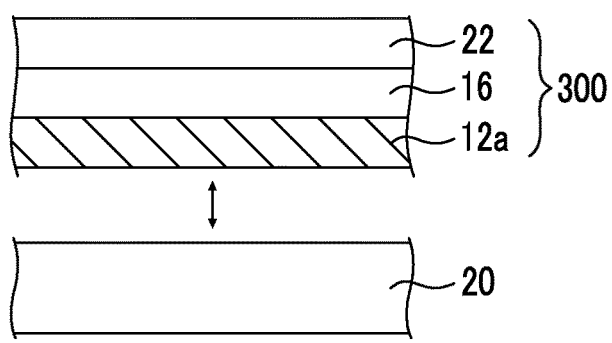

FIG. 3B is a partial cross-sectional view schematically illustrating an example of the state after the detachment between the first substrate 20 and the photocatalyst layer 12a in the case in which the photocatalyst electrode has the second substrate 22, and the diagram illustrates the situation in which the first substrate 20 and the photocatalyst layer 12a (and the current collecting layer 16 and the second substrate 22) are separated, and thereby a photocatalyst electrode for water decomposition 300 is obtained.

In the example of FIG. 3B, the detachment step is carried out after the lamination of the second substrate 22 (after the second substrate laminating step); however, the invention is not limited to this, and the detachment step may be carried out before the second substrate laminating step.

The method of providing the second substrate 22 is not particularly limited; however, for example, a method of adhering the current collecting layer 16 and the second substrate 22 using an adhesive such as a carbon tape (for example, trade name "CARBON DOUBLE-SIDED TAPE for SEM (aluminum base material)" of Nisshin EM Co., Ltd.) may be employed.

The thickness of the second substrate 22 is not particularly limited; however, for example, the thickness is 1 to 30 mm.

As the second substrate 22, for example, a glass plate, a Ti plate, or a Cu plate can be used.

(Catalyst Promoter Supporting Step)

The catalyst promoter supporting step is a step of supporting a catalyst promoter on the photocatalyst layer after the detachment step. That is, through the present step, a catalyst promoter is applied on a surface of the photocatalyst layer (that is, the side of the surface where the first substrate was formed before the detachment step).

As such, by supporting a catalyst promoter on the photocatalyst layer, the photocurrent density of the photocatalyst electrode for water decomposition thus obtainable can be further increased.

The method of supporting the catalyst promoter is not limited to this; however, for example, a general method such as an impregnation method or a photo electrodeposition method can be used.

The catalyst promoter is preferably a metal such as Mn, Fe, Co, Ni, Cu, Ru, Rh, Pd, Ag, In, W, Ir or Pt, or a hydroxide thereof; more preferably a metal such as Mn, Co, Ni, Ru, Rh or Ir, or a hydroxide thereof; and even more preferably $Co(OH)_X$ ($Co(OH)_2$ or $Co(OH)_3$).

(Others)

In conventional methods for producing a photocatalyst electrode for water decomposition, a cleaning step may be carried out using desired solvents (for example, hydrofluoric acid, a mixed solvent of nitric acid and water, various organic solvents, and water), for the purpose of removing those components originating from the first substrate attached to the surface of the photocatalyst layer, after the first substrate is detached.

However, in the method for producing a photocatalyst electrode for water decomposition of the invention, since the detachability between the first substrate and the photocatalyst layer is excellent, attachment of components originating from the first substrate to the surface occurs to a reduced extent, even if a cleaning step is not carried out.

Therefore, in the method for producing a photocatalyst electrode for water decomposition of the invention, a cleaning step of cleaning the photocatalyst layer may not be carried out (in other words, the cleaning step may be omitted). Thereby, the photocatalyst layer is not subjected to damage by cleaning, and therefore, there is an advantage that the photocurrent density of the photocatalyst electrode for water decomposition is further increased.

The photocatalyst electrode for water decomposition obtained by the method for producing a photocatalyst electrode for water decomposition of the invention brings the above-described excellent effects. Furthermore, since the photocatalyst electrode for water decomposition has excellent detachability between the first substrate and the photocatalyst layer, there is an advantage that the first substrate can be reutilized.

According to the method for producing a photocatalyst electrode for water decomposition of the invention, a portion of the photocatalyst layer is not likely to remain on the substrate after the detachment step. Therefore, the thickness of the photocatalyst layer after the detachment step becomes close to the value at the time of setting. That is, according to the method for producing a photocatalyst electrode for water decomposition of the invention, it becomes easy to control the thickness of the photocatalyst layer, and therefore, there is an advantage that a design that matches the penetration length intrinsic to the photocatalyst can be easily achieved.

By bringing a photocatalyst electrode for water decomposition obtained as such into contact with water, and irradiating the photocatalyst electrode with water, decomposition of water proceeds, and oxygen or hydrogen is produced.

The light that is radiated may be any light that can generate a photodecomposition reaction, and specifically, visible light such as solar light, ultraviolet light, infrared light, or the like can be utilized. Among them, solar light that is inexhaustibly supplied is preferred.

A water decomposition apparatus that includes the photocatalyst electrode for water decomposition exhibits excellent characteristics, and regarding the configuration other than the photocatalyst electrode for water decomposition (for example, a counter electrode), any known configuration can be used.

EXAMPLES

Hereinafter, the invention will be explained in more detail by way of Examples; however, the invention is not intended to be limited to these.

Examples 1 to 6

(Metal Layer Forming Step (Production of Ta/Si))

A Si substrate (manufactured by Nilaco Corporation, low resistance type, orientation (100) N-type) cut into a size of 1×1 cm$^2$ was subjected to ultrasonic cleaning using various solvents, namely, acetone, 2-propanol, and water, for 10 minutes for each solvent.

A Ta thin film (Ta layer) was produced on the cleaned Si substrate by RF sputtering (Ulvac, MNS-2000-RFG3) so as to obtain a film thickness of 250 nm, and thus a Ta layer on a Si substrate (Ta/Si) was obtained.

Regarding the target, Ta manufactured by Kojundo Chemical Laboratory Co., Ltd. (99.95%) was used, and the power output was set to 100 W, while the sputtering rate was set to 25 nm/min. The pressure (back pressure) was set to $2.0×10^{-5}$ Pa, and the pressure at the time of Ar introduction was set to $1.0×10^{-1}$ Pa. Furthermore, the distance between the Si substrate (sample) and the Ta target was set to 10 cm, and the substrate temperature was set to 500° C.

For the identification of the Ta layer, an XRD (X-ray diffraction) analyzer (manufactured by Rigaku Corporation, product name "Horizontal Sample Type Multi-purpose X-ray Diffraction Apparatus ULTIMA III") was used. As a result of the XRD analysis, it was confirmed that Ta was formed on the Si substrate by the metal layer forming steps of Examples 1 to 6.

(Photocatalyst Layer Forming Step (Production of $Ta_3N_5$/Si))

Next, the Ta/Si substrate was calcined (heated) for 2 hours under any one temperature condition selected from 500° C., 700° C., 900° C., and 1,000° C. in air, and thus a $Ta_2O_5$ thin film ($Ta_2O_5$ layer) was obtained (oxidation treatment).

Furthermore, $Ta_2O_5$/Si was calcined (heated) for 2 hours under any one temperature condition selected from 800° C., 900° C., and 1,000° C. under an ammonia gas stream (100 sccm ($1.69×10^{-1}$ Pa·m$^3$/sec)), and thus a $Ta_3N_5$ thin film ($Ta_3N_5$ layer) on a Si substrate was obtained (nitriding treatment, $Ta_3N_5$/Si).

In regard to Examples 1 to 6, the calcination temperature at the time of the oxidation treatment, and the calcination temperature at the time of the nitriding treatment are presented in Table 1.

For the identification of $Ta_2O_5$ and $Ta_3N_5$, an XRD (X-ray diffraction) analysis (Rigaku Corporation, Horizontal Sample Type Multi-purpose X-ray Diffraction Apparatus ULTIMA III) was used. As a result of the XRD analysis, it was confirmed that $Ta_2O_5$ and $Ta_3N_5$ were formed after the various treatments of Examples 1 to 6.

(Contact Layer Forming Step (Production of Ta/Ta$_3$N$_5$/Si))

A Ta layer having a film thickness of 100 nm was formed on (immediately above) the Ta$_3$N$_5$ layer obtained as described above (Ta/Ta$_3$N$_5$/Si), by RF sputtering (Ulvac, MNS-2000-RFG3).

(Current Collecting Layer Forming Step (Production of Ti/Ta/Ta$_3$N$_5$/Si))

Subsequently, a Ti layer having a film thickness of 5 μm was formed on (immediately above) the Ta layer (Ti/Ta/Ta$_3$N$_5$/Si) by RF sputtering (Ulvac, MNS-2000-RFG3), and this was used as a sample for detachment, as will be described below.

(Detachment Step (Ta$_3$N$_5$/Ta/Ti))

For the sample for detachment obtained as described above, the Si substrate was gripped with a pair of tweezers, the other layers were gripped with another pair of tweezers, and the Si substrate was detached from the other layers (detachment step). This was reversed, and thus a Ta$_3$N$_5$/Ta/Ti thin film was obtained.

Figure 4:
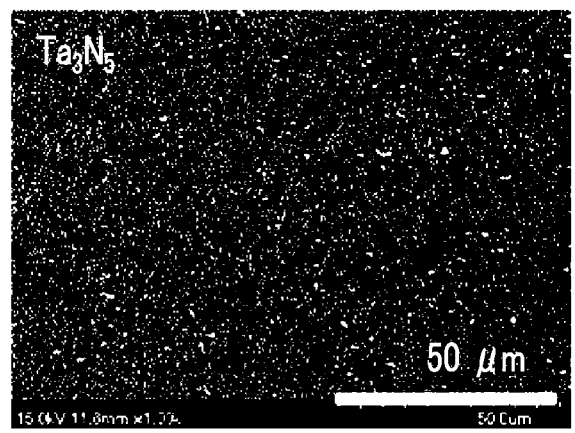
FIG. 4 is an image taken by observing the morphology of the surface of the photocatalyst layer after the detachment step in Example 3.

In Example 3, the morphology of the surface of the photocatalyst layer (Ta$_3$N$_5$) after the detachment step was observed. Specifically, SEM (scanning electron microscope, Hitachi High-Technologies Corporation, FE-SEM, S-4700) was used. The image of the surface of the photocatalyst layer obtained after the detachment step in Example 3, which was obtained as such, is shown in FIG. 4.

(Formation of Photocatalyst Electrode for Water Decomposition)

The Ta$_3$N$_5$/Ta/Ti thin film thus obtained was fixed on a glass substrate using a carbon tape (manufactured by Nisshin EM Co., Ltd., CARBON DOUBLE-SIDED TAPE for SEM (aluminum base material)) (second laminating step, Ta$_3$N$_5$/Ta/Ti/adhesive layer (carbon tape)/glass).

Thereafter, in order to achieve conduction to the conductive layer (Ta/Ti), an alumina wire and the Ti layer of Ta$_3$N$_5$/Ta/Ti were joined using In. In order to perform a PEC (photoelectric chemistry) analysis, the metal exposed parts (In junction, exposed part of the alumina wire, and the lateral surfaces of the Ta layer and the Ti layer) were coated with an epoxy resin, and thus a Ta$_3$N$_5$ thin film electrode was obtained as a photocatalyst electrode for water decomposition.

The exposed area of the Ta$_3$N$_5$ photocatalyst layer was approximately 0.2 cm$^2$.

(Catalyst Promoter Supporting Step)

The Ta$_3$N$_5$ thin film electrode was immersed for one hour in an aqueous solution obtained by mixing 10 mL of a Co(NO$_3$)$_2$ solution (6.3 mM) and 2.5 mL of NaOH (50 mM), and when the solution turned into a yellow colloid, the electrode was pulled up. Thereby, Ta$_3$N$_5$ thin film electrodes of Examples 1 to 6, in which a colloid of Co(OH)$_X$ was supported as a catalyst promoter on the surface of the Ta$_3$N$_5$ layer (photocatalyst layer), were obtained.

Example 7

After the detachment step and before the formation of the photocatalyst electrode for water decomposition, the Ta$_3$N$_5$/Ta/Ti thin film was immersed for 10 seconds in an aqueous solution of HF and HNO$_3$, and thereby the surface of the Ta$_3$N$_5$ was cleaned (cleaning process). The other steps were carried out in the same manner as in Example 3, and thus a Ta$_3$N$_5$ thin film electrode of Example 7 was obtained.

Comparative Example 1

In the metal layer forming step (production of Ta/Si) described above, while the pressure at the time of introducing Ar during RF sputtering was maintained at $1.0 \times 10^{-1}$ Pa, oxygen gas (O$_2$) was introduced. The pressure at the time of introducing O$_2$ was set to $2.0 \times 10^{-2}$ Pa. Thereby, TaOx/Si, in which a TaOx layer in an amorphous form was formed on the Si substrate, was obtained.

Subsequently, production was carried out in the same manner as in Example 3, except that the oxidation step in the photocatalyst layer forming step was not carried out. Thus, a photocatalyst electrode for water decomposition of Comparative Example 1 was obtained.

The embodiment of Comparative Example 1 is not an embodiment in which the metal layer forming step of forming a metal layer is carried out, and then the photocatalyst layer forming step of forming a photocatalyst layer is carried out by performing an oxidation treatment; but corresponds to an embodiment in which a TaOx layer is formed directly on a Si substrate without performing an oxidation treatment of the metal layer. Then, production is carried out in the same manner as in Example 3 by carrying out the nitriding treatment, the contact layer forming step, the current collecting layer forming step, the detachment step, and the formation of a photoelectrode for water decomposition.

Figure 5:
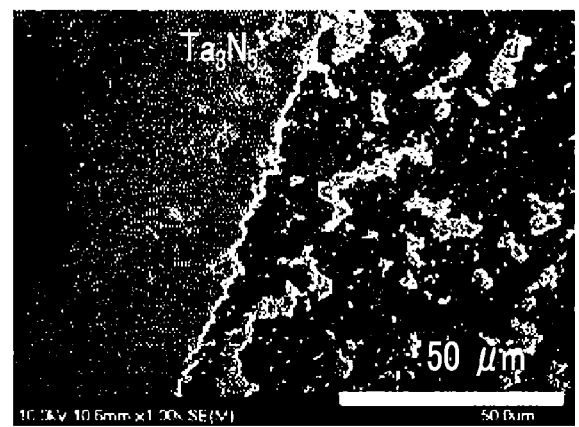
FIG. 5 is an image taken by observing the morphology of the surface of the photocatalyst layer after the detachment step in Comparative Example 1.

In regard to Comparative Example 1, an observation of the morphology of the surface of the photocatalyst layer after the detachment step was conducted using the same apparatus as that used in Example 3. An image of the surface of the photocatalyst layer after the detachment step in Comparative Example 1 obtained as such is presented in FIG. 5.

An XRD (X-ray diffraction) analysis was performed after the production of the TaOx layer and before the nitriding treatment, using the same conditions and apparatus as those used in Example 3, and it was confirmed that a TaOx layer in an amorphous form was formed on the Si substrate.

<Evaluation Test>

(Evaluation of Detachability)

An evaluation of the detachment step described above was performed according to the following criteria, based on the ease of detachment and the state of the surface of the photocatalyst layer (Ta$_3$N$_5$) where the Si substrate was provided, which was checked by visual inspection. The evaluation results are presented in Table 1.

A: Detachment occurred easily, the surface of the photocatalyst layer after detachment was smooth, and the remaining of the components originating from the photocatalyst layer was not recognized.

B: Detachment did not occur easily (or detachment was not possible), or surface unevenness was observed in the surface state of the photocatalyst layer after detachment, and thus the remaining of the components originating from the photocatalyst layer could be recognized.

(Evaluation of Photocurrent Density)

An evaluation of the photocurrent density of the photocatalyst electrode for water decomposition obtained as described above was carried out by the current-potential measurement in a three-electrode system using a potentiostat (Hokuto Denko Corporation, HSV-110).

A plane window-attached separable flask was used for an electrochemical cell, an Ag/AgCl electrode was used as a reference electrode, and a Pt wire was used as a counter electrode. As for a liquid electrolyte, a buffer solution obtained by producing a 0.5 M aqueous solution of K$_2$HPO$_4$ and adjusting the pH of this aqueous solution to 13.0 using an aqueous solution of KOH, was used. The interior of the electrochemical cell was filled with argon, and dissolved oxygen and carbon dioxide were removed by performing sufficient bubbling before measurement. For the photoelectrochemical analysis, a solar simulator (San-Ei Electric Co., Ltd., XES-40S2-CE, AM1.5G) was used as a light source.

For the photocatalyst electrodes for water decomposition produced in the Examples and Comparative examples, the photocurrent density (mA/cm$^2$) at 1.23 V (vs. RHE) was measured. The term RHE is the abbreviation for reversible hydrogen electrode.

<Evaluation Results>

The results of the above-described evaluation are presented in Table 1.

of the photocatalyst layer of Example 3, while a flat continuous film was formed. The image shown in FIG. 5 was also checked. In Comparative Example 1, since the detachability was insufficient, the photocatalyst layer remained on the Si base material, parts of the photocatalyst layer were not transferred to the Ta/Ti layer side, and the formed film was not continuously flat.

Although not shown in the table, production was carried out in the same manner as in Example 3, except that a SiO$_2$ substrate or a Si$_3$N$_4$ substrate was used instead of the Si substrate in the metal layer forming step, and the evaluations described above were performed. As a result, it was found

TABLE 1

| | Layer configuration after metal layer forming step | Layer configuration after oxidation treatment | Layer configuration after nitriding treatment | Calcination temperature (° C.) | Nitriding temperature (° C.) | Cleaning step for photocatalyst layer | Evaluation results | |
|---|---|---|---|---|---|---|---|---|
| | | | | | | | Detachability | Photocurrent density (mA/cm$^2$) |
| EXAMPLE 1 | Ta/Si | Ta$_2$O$_5$/Si | Ta$_3$N$_5$/Si | 500 | 900 | Absent | A | 0.85 |
| EXAMPLE 2 | Ta/Si | Ta$_2$O$_5$/Si | Ta$_3$N$_5$/Si | 700 | 900 | Absent | A | 1.9 |
| EXAMPLE 3 | Ta/Si | Ta$_2$O$_5$/Si | Ta$_3$N$_5$/Si | 900 | 900 | Absent | A | 2.2 |
| EXAMPLE 4 | Ta/Si | Ta$_2$O$_5$/Si | Ta$_3$N$_5$/Si | 1000 | 900 | Absent | A | 1.4 |
| EXAMPLE 5 | Ta/Si | Ta$_2$O$_5$/Si | Ta$_3$N$_5$/Si | 900 | 800 | Absent | A | 0.38 |
| EXAMPLE 6 | Ta/Si | Ta$_2$O$_5$/Si | Ta$_3$N$_5$/Si | 900 | 1000 | Absent | A | 0.66 |
| EXAMPLE 7 | Ta/Si | Ta$_2$O$_5$/Si | Ta$_3$N$_5$/Si | 900 | 900 | Present | A | 1.85 |
| COMPARATIVE EXAMPLE 1 | TaOx/Si | — | Ta$_3$N$_5$/Si | 900 | 900 | Absent | B | 0.1 |

As shown in Table 1, it was found that a photocatalyst electrode for water decomposition having excellent detachment between the photocatalyst layer and the substrate (Si substrate) and having excellent photocurrent density is obtained by producing a photocatalyst electrode for water decomposition by forming a metal layer by a vapor phase film-forming method, and then subjecting the metal layer thus obtained to a treatment such as an oxidation treatment (Examples 1 to 7).

In a comparison of Examples 1 to 4, it was found that a photocatalyst electrode for water decomposition having excellent photocurrent density is obtained by adjusting the calcination temperature at the time of an oxidation treatment in the range of 700° C. to 1,000° C. (Examples 2 to 4).

In a comparison of Examples 3, 5 and 6, it was found that a photocatalyst electrode for water decomposition having excellent photocurrent density is obtained by adjusting the calcination temperature at the time of a nitriding treatment in the range of 900° C. to 1,000° C. (Examples 3 and 6).

In a comparison of Examples 3 and 7, it was found that a photocatalyst electrode for water decomposition having excellent photocurrent density is obtained by not performing a cleaning process for the photocatalyst layer after the detachment step (Example 3).

Meanwhile, in Comparative Example 1, a TaOx layer (metal oxide layer) was formed directly on a Si substrate, without having a process for forming a metal layer. As a result, even if a nitriding treatment was performed, the Si substrate was not easily detached during the detachment step. It is speculated that since a metal layer was not formed, density change occurred insufficiently, and this caused the difficulty in detachment. Also, the photocurrent density of the photocatalyst electrode for water decomposition thus obtained was lowered.

The image shown in FIG. 4 was checked, and elimination of the photocatalyst layer was unrecognizable at the surface that Example 3 (case in which a Si substrate was used) exhibited both superior detachability and superior photocurrent density.

EXPLANATION OF REFERENCES

12: metal layer
12a: photocatalyst layer
14: contact layer
16: current collecting layer
20: first substrate
22: second substrate
100, 200, 300: photocatalyst electrode for water decomposition

What is claimed is:

1. A method for producing a photocatalyst electrode for water decomposition, the method comprising:
    a metal layer forming step of forming a metal layer on one surface of a first substrate by a vapor phase film-forming method or a liquid phase film-forming method;
    a photocatalyst layer forming step of forming a photocatalyst layer by subjecting the metal layer to at least one treatment selected from an oxidation treatment, a nitriding treatment, a sulfurization treatment, or a selenization treatment;
    a current collecting layer forming step of forming a current collecting layer on a surface of the photocatalyst layer, the surface being on the opposite side of the first substrate; and
    a detachment step of detaching the first substrate from the photocatalyst layer.

2. The method for producing a photocatalyst electrode for water decomposition according to claim 1, wherein the photocatalyst layer forming step is a step of performing the oxidation treatment, and then performing at least one treatment selected from the nitriding treatment, the sulfurization treatment, and the selenization treatment.

3. The method for producing a photocatalyst electrode for water decomposition according to claim 2, wherein the metal that constitutes the metal layer is at least one metal selected from the group consisting of Ta, Nb, Ti, W, Ba, La, Sr, Ca, Fe, Bi, V, Zn, Cu, Ni, Pb, Ag, Cd, Ga, In, Sm, and Mg.

4. The method for producing a photocatalyst electrode for water decomposition according to claim 2, further comprising:
    after the photocatalyst layer forming step and before the current collecting layer forming step, a contact layer forming step of forming a contact layer containing a semiconductor or a good conductor on a surface of the photocatalyst layer, the surface being on the opposite side of the first substrate.

5. The method for producing a photocatalyst electrode for water decomposition according to claim 2, further comprising:
    after the current collecting layer forming step and before the detachment step, a second substrate laminating step of laminating a second substrate on a surface of the current collecting layer, the surface being on the opposite side of the photocatalyst layer.

6. The method for producing a photocatalyst electrode for water decomposition according to claim 2, wherein the photocatalyst layer has a thickness of 100 nm to 1,200 nm.

7. The method for producing a photocatalyst electrode for water decomposition according to claim 2, wherein the first substrate is a silicon substrate.

8. The method for producing a photocatalyst electrode for water decomposition according to claim 1, wherein the metal that constitutes the metal layer is at least one metal selected from the group consisting of Ta, Nb, Ti, W, Ba, La, Sr, Ca, Fe, Bi, V, Zn, Cu, Ni, Pb, Ag, Cd, Ga, In, Sm, and Mg.

9. The method for producing a photocatalyst electrode for water decomposition according to claim 8, further comprising:
    after the photocatalyst layer forming step and before the current collecting layer forming step, a contact layer forming step of forming a contact layer containing a semiconductor or a good conductor on a surface of the photocatalyst layer, the surface being on the opposite side of the first substrate.

10. The method for producing a photocatalyst electrode for water decomposition according to claim 8, further comprising:
    after the current collecting layer forming step and before the detachment step, a second substrate laminating step of laminating a second substrate on a surface of the current collecting layer, the surface being on the opposite side of the photocatalyst layer.

11. The method for producing a photocatalyst electrode for water decomposition according to claim 8, wherein the photocatalyst layer has a thickness of 100 nm to 1,200 nm.

12. The method for producing a photocatalyst electrode for water decomposition according to claim 8, wherein the first substrate is a silicon substrate.

13. The method for producing a photocatalyst electrode for water decomposition according to claim 1, further comprising:
    after the photocatalyst layer forming step and before the current collecting layer forming step, a contact layer forming step of forming a contact layer containing a semiconductor or a good conductor on a surface of the photocatalyst layer, the surface being on the opposite side of the first substrate.

14. The method for producing a photocatalyst electrode for water decomposition according to claim 13, further comprising:
    after the current collecting layer forming step and before the detachment step, a second substrate laminating step of laminating a second substrate on a surface of the current collecting layer, the surface being on the opposite side of the photocatalyst layer.

15. The method for producing a photocatalyst electrode for water decomposition according to claim 13, wherein the photocatalyst layer has a thickness of 100 nm to 1,200 nm.

16. The method for producing a photocatalyst electrode for water decomposition according to claim 13, wherein the first substrate is a silicon substrate.

17. The method for producing a photocatalyst electrode for water decomposition according to claim 1, further comprising:
    after the current collecting layer forming step and before the detachment step, a second substrate laminating step of laminating a second substrate on a surface of the current collecting layer, the surface being on the opposite side of the photocatalyst layer.

18. The method for producing a photocatalyst electrode for water decomposition according to claim 17, wherein the photocatalyst layer has a thickness of 100 nm to 1,200 nm.

19. The method for producing a photocatalyst electrode for water decomposition according to claim 1, wherein the photocatalyst layer has a thickness of 100 nm to 1,200 nm.

20. The method for producing a photocatalyst electrode for water decomposition according to claim 1, wherein the first substrate is a silicon substrate.

* * * * *